United States Patent
Kadota

(10) Patent No.: US 6,291,258 B2
(45) Date of Patent: Sep. 18, 2001

(54) SEMICONDUCTOR PHOTONIC DEVICE, METHOD FOR MAKING THE SAME, AND METHOD FOR FORMING ZNO FILM

(75) Inventor: Michio Kadota, Kyoto (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/753,590

(22) Filed: Jan. 2, 2001

Related U.S. Application Data

(62) Division of application No. 09/342,869, filed on Jun. 29, 1999.

(30) Foreign Application Priority Data

Jul. 21, 1998 (JP) ................................. 10-205125

(51) Int. Cl.$^7$ .................................................. H01L 21/00
(52) U.S. Cl. ........................................................... 438/46
(58) Field of Search .................................. 438/46

(56) References Cited

FOREIGN PATENT DOCUMENTS

| 8-116090 | 5/1996 | (JP) . |
| 8-139361 | 5/1996 | (JP) . |
| 10-173228 | 6/1998 | (JP) . |
| 10-178202 | 6/1998 | (JP) . |

OTHER PUBLICATIONS

Srivastav et al., Effects of oxygen on the physical parameters of RF sputtered ZnO thin film, 1989, J. Phys D V22, pp1768–1772.*

"Growth and Structure Characterization of GaN Crystal on Polycrystalline ZnO Substrate by ECR–MBE Process"; H. Tochishita, et al.; *Journal of Japanese Association of Crystal Growth*; vol. 25, No. 3; 1998; p. A38.

"In–plane Structure Characterization of ZnO Nanocrystal Films Using Four–Circles X–ray Diffractometer"; I. Ohkubo, et al.; The Japan Society of Applied Physics; Catalog No. AP971120–01; No. 1; 58$^{th}$ Autumn Meeting; 1997; p. 281.

"Relation between optical property and crystallinity of ZnO thin films prepared by rf magnetron sputtering"; Syuichi Takada; J. Appl. Phys.; 73 (10); May 15, 1993, pp. 4739–42.

* cited by examiner

*Primary Examiner*—Olik Chaudhuri
*Assistant Examiner*—Douglas A. Wille
(74) *Attorney, Agent, or Firm*—Ostrolenk, Faber, Gerb & Soffen, LLP

(57) ABSTRACT

A semiconductor photonic device contains a substrate; a ZnO buffer layer provided on the substrate; and a semiconductor compound provided on the ZnO buffer layer and represented by $In_xGa_yAl_zN$ wherein $x+y+z=1$, $0 \leq x \leq 1$, $0 \leq y \leq 1$ and $0 \leq z \leq 1$, wherein the ZnO buffer layer has a lattice constant of about 5.2070 Å or more in the c-axis direction.

8 Claims, 7 Drawing Sheets

SEMICONDUCTOR PHOTONIC DEVICE, METHOD FOR MAKING THE SAME, AND METHOD FOR FORMING ZNO FILM

This is a division of application Ser. No. 09/342,869, filed Jun. 29, 1999.

BACKGROUND OF THE INVENTION

1. Field of the Invention

The present invention relates to a semiconductor photonic device, a method for making the same, and a method for forming a ZnO film. In particular, the present invention relates to a semiconductor photonic device using a Group III-V compound, such as GaN, InGaN, GaAlN or InGaAlN and a method for making the same. Also, the present invention relates to a method for making a ZnO film formed on a substrate, such as a Si substrate or a glass substrate.

2. Description of the Related Art

As materials for semiconductor photonic devices, such as light-emitting diodes (LEDs) and semiconductor laser diodes (LDs) which emit blue or ultraviolet light, Group III-V semiconductor compounds represented by the general formula $In_xGa_yAl_zN$ wherein $x+y+z=1$, $0 \leq x \leq 1$, $0 \leq y \leq 1$, and $0 \leq z \leq 1$ are known. Since the semiconductor compounds are of direct transition type, they have high luminescent efficiency. Furthermore, since the luminescent wavelength can be controlled by the indium content, they have attracted attention as materials for photonic devices.

Since it is difficult to make a large $In_xGa_yAl_zN$ single crystal, a so-called heteroepitaxial growth process in which an $In_xGa_yAl_zN$ film is grown on a substrate composed of a different material is used in the production of the crystal film, and it is typically grown on a C-plane sapphire substrate. Because the C-plane sapphire substrate is expensive and there exists a large lattice mismatch between the C-plane sapphire substrate and the $In_xGa_yAl_zN$ film (for example, the lattice mismatch rate for GaN ranges to 16.1%), many crystal defects with a defect density of $10^8/cm^2$ to $10^{11}/cm^2$ are inevitably formed in the grown crystal, and thus a high-quality crystal film having high crystallinity cannot be formed.

In order to solve this problem, a proposed method for obtaining a crystal with decreased defects by reducing lattice mismatch when $In_xGa_yAl_zN$ is deposited on a C-plane sapphire substrate is to provide a polycrystalline or amorphous AlN buffer layer or a low-temperature-deposited GaN buffer layer on the C-plane sapphire substrate. Since this method can reduce the lattice mismatch not only between the C-plane sapphire substrate and the buffer layer but also between the buffer layer and the $In_xGa_yAl_zN$, a crystal film with reduced defects can be formed. The C-plane sapphire substrate used in this method, however, is expensive and since the configuration is complicated, higher production costs are unavoidable.

A SiC substrate has been studied and has small lattice mismatch (for example, the lattice mismatch rate for GaN is 3.5%). The SiC substrate, however, is considerably expensive compared to the C-plane sapphire substrate (its price is approximately ten times the price of the C-plane sapphire substrate).

Accordingly, production of a semiconductor photonic device using an inexpensive Si or glass substrate has been desired. A possible method is depositing a ZnO buffer layer on a Si or glass substrate, and providing a GaN layer on the ZnO buffer layer followed by forming an $In_xGa_yAl_zN$ semiconductor layer for emitting light on the GaN layer (or providing an $In_xGa_yAl_zN$ semiconductor layer containing a GaN layer). Because the lattice constant in the a-axis direction (hereinafter referred to as "a-constant") and the lattice constant in the c-axis direction (herein after referred to as "c-constant") of the ZnO single crystal are nearly equal to the a-constant and the c-constant, respectively, of GaN, a GaN layer with reduced lattice defects is considered to be formed. The ZnO crystal is hexagonal and the crystal grows so that the c-axis direction is perpendicular to the surface of the Si or glass substrate whereas the a-axis direction is parallel to the surface of the Si or glass substrate.

TABLE 1

| Crystal | a-constant | c-constant |
|---------|------------|------------|
| GaN     | 3.1860 Å   | 5.1780 Å   |
| ZnO     | 3.24982 Å  | 5.20661 Å  |

A device having a ZnO buffer layer provided on a Si substrate has a substrate cost which is approximately one-tenth that of a C-plane sapphire substrate and thus cost reduction can be achieved. Since the Si substrate can have conductivity in contrast to insulating characteristics of the C-plane sapphire, a p-type electrode and a n-type electrode can be provided on the upper face and the lower face and the device configuration can be simplified.

A lattice mismatch rate of 2% is still present between the ZnO buffer layer formed on the Si substrate and GaN layer, as shown in Table 1, although the rate is smaller than that in a combination of GaN and a C-plane sapphire substrate or a SiC substrate. Thus, defects formed by the lattice mismatch still remain.

SUMMARY OF THE INVENTION

The present invention is directed to solve the above-explained technical problems. The semiconductor photonic device comprises: a substrate; a ZnO buffer layer provided on the substrate; and a semiconductor compound provided on the ZnO buffer layer and represented by $In_xGa_yAl_zN$ wherein $x+y+z=1$, $0 \leq x \leq 1$, $0 \leq y \leq 1$ and $0 \leq z \leq 1$, wherein the ZnO buffer layer has a lattice constant of about 5.2070 Å or more in the c-axis direction.

It is preferable that the ZnO buffer layer has a lattice constant of about 5.21 to 5.28 Å in the c-axis direction and a lattice constant of about 3.24 to 3.17 Å in the a-axis direction.

The method for making a semiconductor photonic device which comprises a semiconductor compound represented by $In_xGa_yAl_zN$ wherein $x+y+z=1$, $0 \leq x \leq 1$, $0 \leq y \leq 1$ and $0 \leq z \leq 1$, comprises when the lattice constant in the a-axis direction of the compound semiconductor formed on the Zn buffer layer is smaller than the lattice constant in the a-axis direction of a ZnO single crystal, the lattice constant in the c-axis direction of a ZnO buffer layer is adjusted so as to be larger than the lattice constant in the c-axis direction of the ZnO single crystal, and when the lattice constant in the a-axis direction of the semiconductor compound formed on the Zn buffer layer is larger than the lattice constant in the a-axis direction of the ZnO single crystal, the lattice constant in the c-axis direction of the ZnO buffer layer is adjusted so as to be smaller than the lattice constant in the c-axis direction of the ZnO single crystal, so that the lattice constant in the a-axis direction of the ZnO buffer layer is nearly equal to the lattice constant in the a-axis direction of the semiconductor compound.

The method forms a ZnO film on a substrate in which the lattice constant in the a-axis direction of the ZnO film is controlled by the lattice constant in the c-axis direction of the ZnO film.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1:
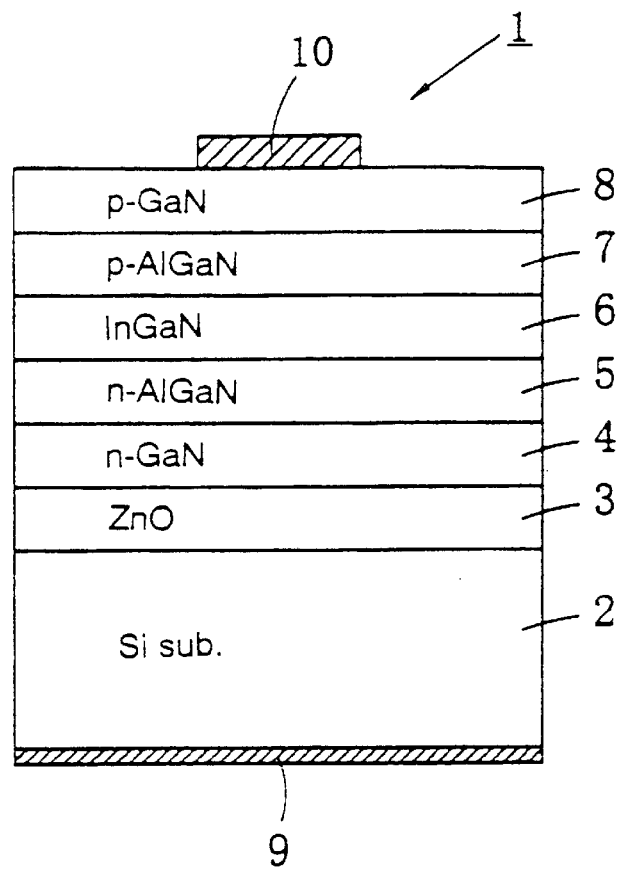
FIG. 1 is a cross-sectional view of a configuration of a semiconductor photonic device in accordance with an embodiment of the present invention.
Figure 2:
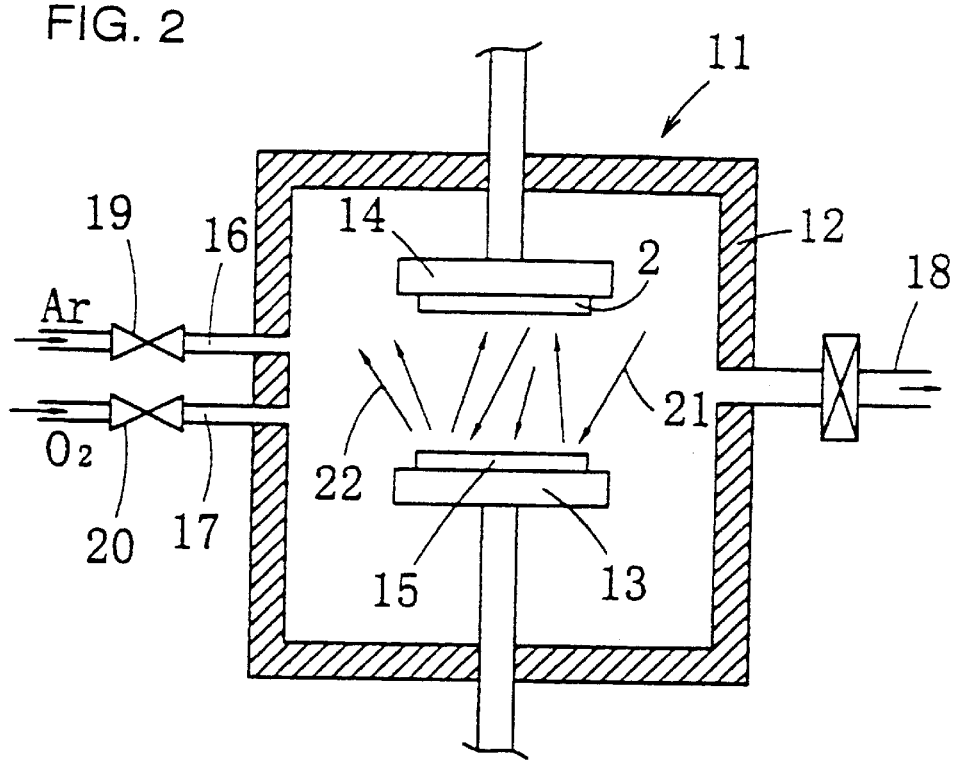
FIG. 2 is an outline view showing depositing a ZnO buffer layer on a Si substrate using a sputtering system.

Direct control of the lattice constant in the a-axis direction of the ZnO film deposited on a Si or glass substrate has been considered to be difficult due to the effects of the lattice constant of the substrate. In the method for forming the ZnO film in accordance with the present invention, the lattice constant in the a-axis direction of the ZnO film can be controlled by the lattice constant in the c-axis direction of the ZnO film. The lattice constant in the c-axis direction of the ZnO film can be controlled by controlling parameters for depositing the ZnO film.

This method is applicable to a method for making a semiconductor photonic device using a semiconductor compound represented by $In_xGa_yAl_zN$ wherein $x+y+z=1$, $0 \leq x \leq 1$, $0 \leq y \leq 1$ and $0 \leq z \leq 1$. If the lattice constant in the a-axis direction of the semiconductor compound formed on a Zn buffer layer is smaller than the lattice constant in the a-axis direction of a ZnO single crystal, the lattice constant in the c-axis direction of a ZnO buffer layer can be adjusted so as to be larger than the lattice constant in the c-axis direction of the ZnO single crystal. In contrast, if the lattice constant in the a-axis direction of the semiconductor compound formed on the Zn buffer layer is larger than the lattice constant in the a-axis direction of the ZnO single crystal, the lattice constant in the c-axis direction of the ZnO buffer layer can be adjusted so as to be smaller than the lattice constant in the c-axis direction of the ZnO single crystal. Since the lattice constant in the a-axis direction of the ZnO buffer layer is close to the lattice constant in the a-axis direction of the semiconductor compound, a semiconductor compound having high crystallinity can be formed on the ZnO buffer layer.

As an actual application, a ZnO buffer layer having a lattice constant in the c-axis direction of 5.2070 Å or more is formed on a substrate and a GaN layer is formed on the ZnO buffer layer in a semiconductor photonic device using a semiconductor compound represented by $In_xGa_yAl_zN$ wherein $x+y+z=1$, $0 \leq x \leq 1$, $0 \leq y \leq 1$ and $0 \leq z \leq 1$.

When the lattice constant in the c-axis direction of the ZnO buffer layer is controlled to be about 5.2070 Å or more, the lattice constant in the a-axis direction of the ZnO buffer layer can be controlled to be smaller than the lattice constant in the a-axis direction of the ZnO single crystal. Since the difference between the lattice constant in the a-axis direction of the ZnO buffer layer and the lattice constant of the GaN layer can be reduced compared to conventional methods, the lattice mismatch between the ZnO buffer layer and the GaN layer can be reduced.

When the lattice constant in the c-axis direction of the Zno buffer layer is in a range of about 5.21 to 5.28 Å, the lattice constant in the a-axis direction is controlled to a range from about 3.24 to 3.17 Å, which is closer to the lattice constant of the GaN layer.

FIG. 1 shows a semiconductor photonic device 1 having a double heterojunction configuration in accordance with an embodiment of the present invention, and represents a light emitting diode or a surface-emitting laser diode provided with an InGaN layer 6 as a luminescent layer. In the semiconductor photonic device 1, a ZnO buffer layer 3 having small specific resistivity is deposited on a conductive Si substrate 2, and an n-type GaN layer 4, an n-type AlGaN layer 5, an InGaN layer (luminescent layer) 6, a p-type AlGaN layer 7 and a p-type GaN layer 8 are deposited on the ZnO buffer layer 3 in that order. The n-type GaN layer 4, the n-type AlGaN layer 5, the InGaN layer (luminescent layer) 6, the p-type AlGaN layer 7 and the p-type GaN layer 8 form a double heterojunction configuration. Furthermore, an n-type electrode 9 is provided on the entire lower surface of the Si substrate 2 and a p-type electrode 10 is partially provided on the upper surface of the p-type GaN layer 8. When a voltage is applied between the p-type electrode 10 and the n-type electrode 9, a current is injected into the InGaN layer 6 from the p-type electrode 10 to emit light, and the light emitted from the InGaN layer 6 emerges from the region not provided with the p-type electrode 10 on the p-type GaN layer 8 toward the exterior.

In such a semiconductor photonic device 1 as described in the conventional example, it is important to reduce lattice mismatch between the ZnO buffer layer 3 formed on the Si substrate 2 and the n-type GaN layer 4 as much as possible. Thus, the ZnO buffer layer 3 is formed as described below in this embodiment of the present invention.

The ZnO buffer layer 3 is formed on the Si substrate 2 by a sputtering process rather than an evaporation process, a CVD process or an ion plating process. In a sputtering system 11 for depositing the ZnO buffer layer 3, a cathode 13 and an anode 14 are provided in a chamber 12, Zn or ZnO as a target 15 is provided on the cathode 13 and the Si substrate 2 is placed on the anode 14. Furthermore, a pipe 16 for introducing Ar gas, a pipe 17 for introducing $O_2$ gas and an exhaust duct 18 are provided with the chamber 12. The flow rate of the Ar gas and the $O_2$ gas can be controlled by regulating valves 19 and 20. The sputtering system 11 has a temperature controlling unit (not shown in the drawing) for controlling the substrate-heating temperature Tc constant.

The Ar gas and the $O_2$ gas are introduced at given flow rates into the chamber 12 while the gas in the chamber 12 is exhausted through the exhaust duct so as to maintain the chamber at a constant pressure. While the substrate is held at a constant predetermined temperature, a radio frequency voltage is applied between the anode 14 and the cathode 13 to generate plasma between electrodes 13 and 14. Plasma ions 21 collide with the target to discharge Zn or ZnO 22. ZnO discharged from the target or ZnO which is formed by the reaction Zn discharged from the target with the $O_2$ gas is deposited on the surface of the Si substrate 2 to form a polycrystalline ZnO buffer layer 3.

Figure 3:
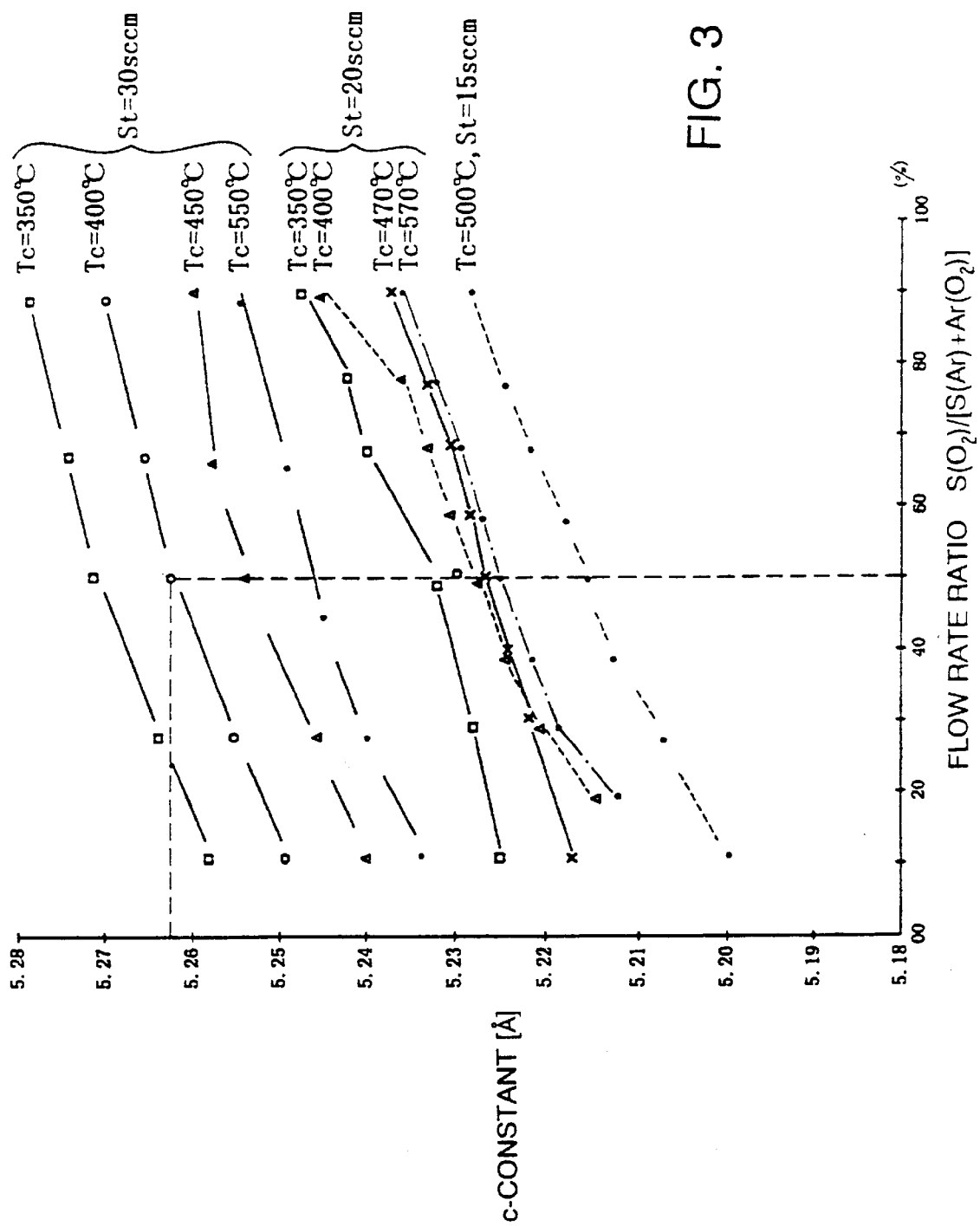
FIG. 3 is a graph showing the relationship between the c-constant of a ZnO buffer layer formed on a Si substrate and the gas flow rate ratio $S(O_2)/[S(Ar)+S(O_2)]$.
Figure 4:
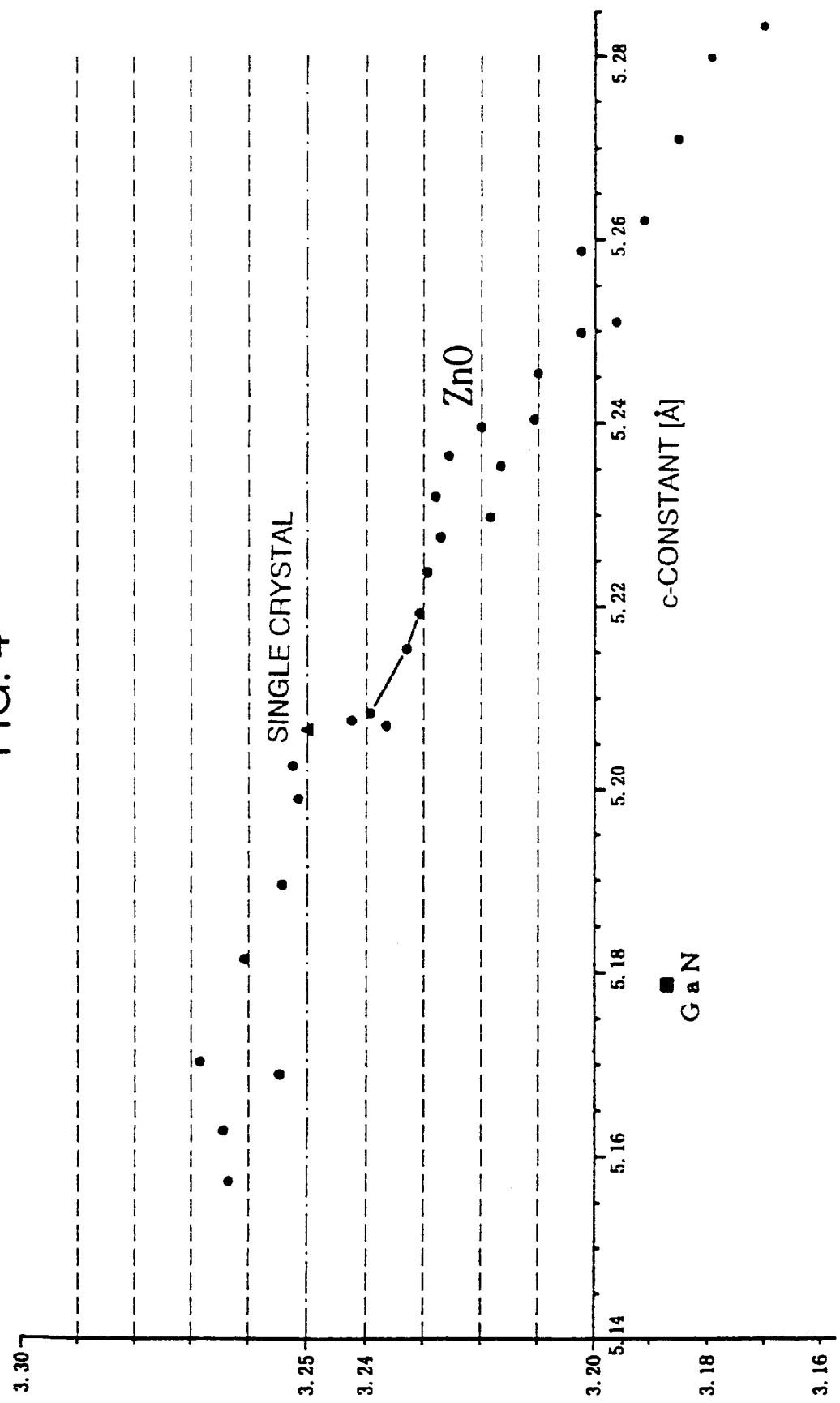
FIG. 4 is a graph showing the relationship between the a-constant and the c-constant of a ZnO buffer layer formed on a Si substrate.

FIG. 3 shows the change in the c-constant of the ZnO buffer layer 3 with respect to the ratio $S(O_2)/[S(Ar)+S(O_2)]$ wherein $S(O_2)$ is the flow rate of the $O_2$ gas and $S(Ar)$ is the flow rate of the Ar gas when the ZnO buffer layer 3 is formed on the surface of the Si substrate 2. The flow rate St in FIG. 3 indicates the total flow rate $S(Ar)+S(O_2)$. FIG. 4 shows the relationship between the a-constant and the c-constant of the ZnO buffer layer 3 formed on the Si substrate 2.

Since the a-constant and the c-constant of the single crystal ZnO is 3.24982 Å and 5.20661 Å, respectively (the lattice constants of the single crystal ZnO are shown by triangles in FIG. 4; refer to Table 1), and the a-constant of the GaN layer is 3.1860 Å (the lattice constant of GaN is shown by a square in FIG. 4; refer to Table 1), the a-constant of the ZnO buffer layer 3 can be close to the a-constant of the GaN layer 4 rather than the single crystal ZnO by controlling the c-constant of the ZnO buffer layer 3 to about 5.2070 Å or more, according to FIG. 4. In particular, the c-constant of the ZnO buffer layer 3 is controlled to be about 5.21 to 5.28 Å so that the a-constant of the Zno buffer layer 3 is about 3.17 to 3.24 Å which is close to the a-constant of the GaN layer 4. More particularly, the a-constant of the ZnO buffer layer 3 can be substantially equal to the a-constant of the GaN layer 4 when the c-constant of the ZnO buffer layer 3 is approximately 5.26Å.

The data shown in FIG. 3 demonstrates that the c-constant of the ZnO buffer layer 3 can be controlled within the above-described desired range when the gas flow rate $St=S(Ar)+S(O_2)$, the gas flow rate ratio $S(O_2)/[S(Ar)+S(O_2)]$ and the substrate heating temperature Tc are controlled. In the sputtering system 11 used for obtaining the data in FIG. 3, for example, when the gas flow rate $St=S(Ar)+S(O_2)=30$ scam and when the substrate heating temperature Tc=approximately 400° C., the gas flow rate ratio $S(O_2)/[S(Ar)+S(O_2)]$ becomes approximately 50%. Thus, the c-constant of the ZnO buffer layer 3 can be controlled to be approximately 5.262 Å, and the corresponding a-constant can be controlled to be near the a-constant, 3.1860 Å, of the GaN layer 4.

The relationship between the c-constant and the a-constant of the ZnO buffer layer 3 is impartial although the relationship between the c-constant of the ZnO buffer layer 3 and the control parameters of the film deposition system varies with the type of the system. Thus, the a-constant of the ZnO buffer layer 3 can be made close to the a-constant of the GaN layer 4 by properly controlling the parameters of the deposition system so that the c-constant of the ZnO buffer layer 3 is a desired value.

(Second Embodiment)

Figure 5:
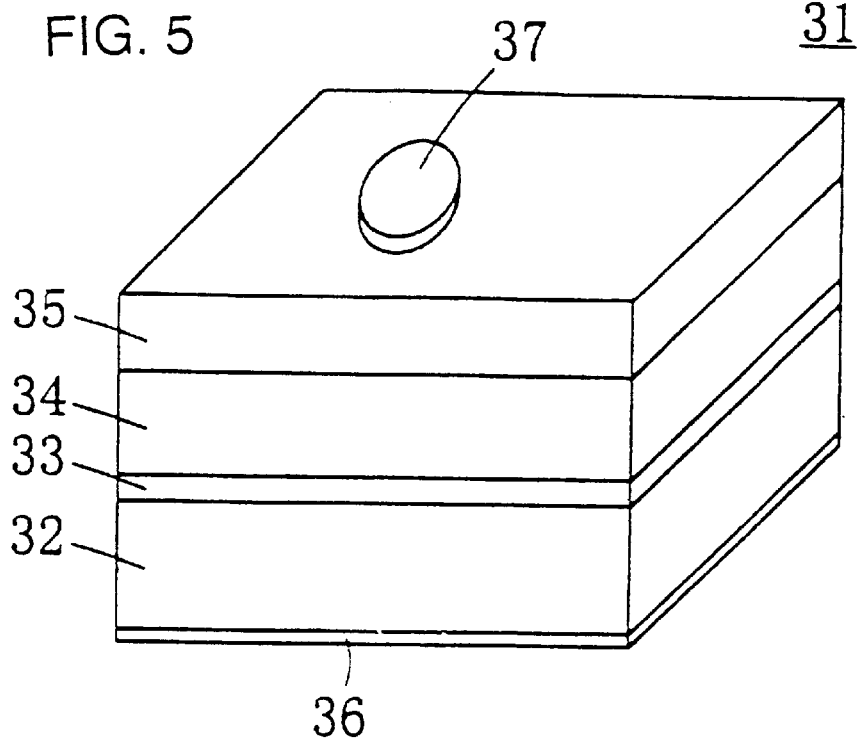
FIG. 5 is an isometric view showing a configuration of a semiconductor photonic device in accordance with another embodiment of the present invention.

The present invention is also applicable to devices other than the semiconductor photonic device having the double heterojunction configuration of the InGaN layer 6 as shown in FIG. 1. For example, as a semiconductor photonic device 31 shown in FIG. 5, a ZnO buffer layer 33 may be deposited on a Si substrate 32, an n-type GaN layer 34 and a p-type GaN layer 35 may be deposited, an n-type electrode 36 may be formed on the lower surface of the Si substrate 32 and a p-type electrode 27 and may be formed on the p-side GaN layer 35. Also, a luminescent device may have a configuration in which a Zno buffer layer, a low-temperature-deposited GaN buffer layer, an n-type GaN layer and a p-type GaN layer are deposited on a glass substrate, although not shown in the drawing.

(Third Embodiment)

Figure 6:
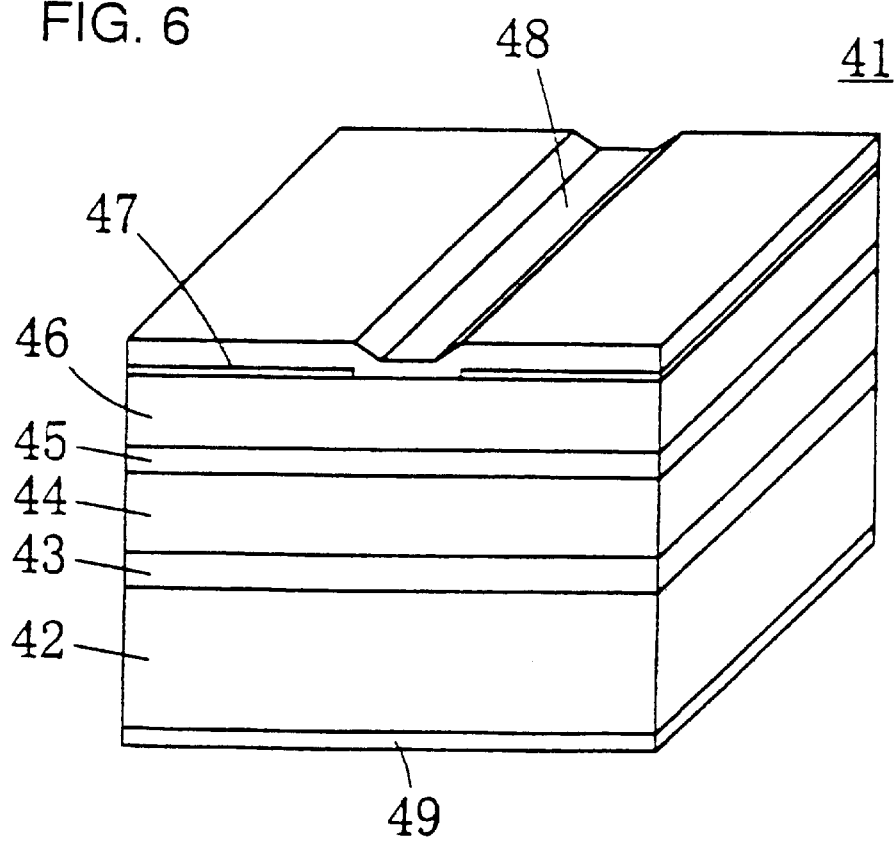
FIG. 6 is an isometric view showing a configuration of a semiconductor photonic device in accordance with another embodiment of the present invention.

The device may be a semiconductor photonic device 41 such as a laser diode or an edge emitting type light emitting diode, as shown in FIG. 6, in which a Zno buffer layer 43 is formed on a Si substrate 42, an n-type GaN clad layer 44, a p-type GaN active layer 45, a p-type GaN clad layer 46 are deposited, a $SiO_2$ film 47 is formed on the region other than the center of the p-type GaN clad layer 46, a p-type electrode 48 is provided over the $SiO_2$ film 47 and the p-type GaN clad layer 46, and an n-type electrode 49 is provided on the lower surface of the Si substrate 42.

(Fourth Embodiment)

Figure 7:
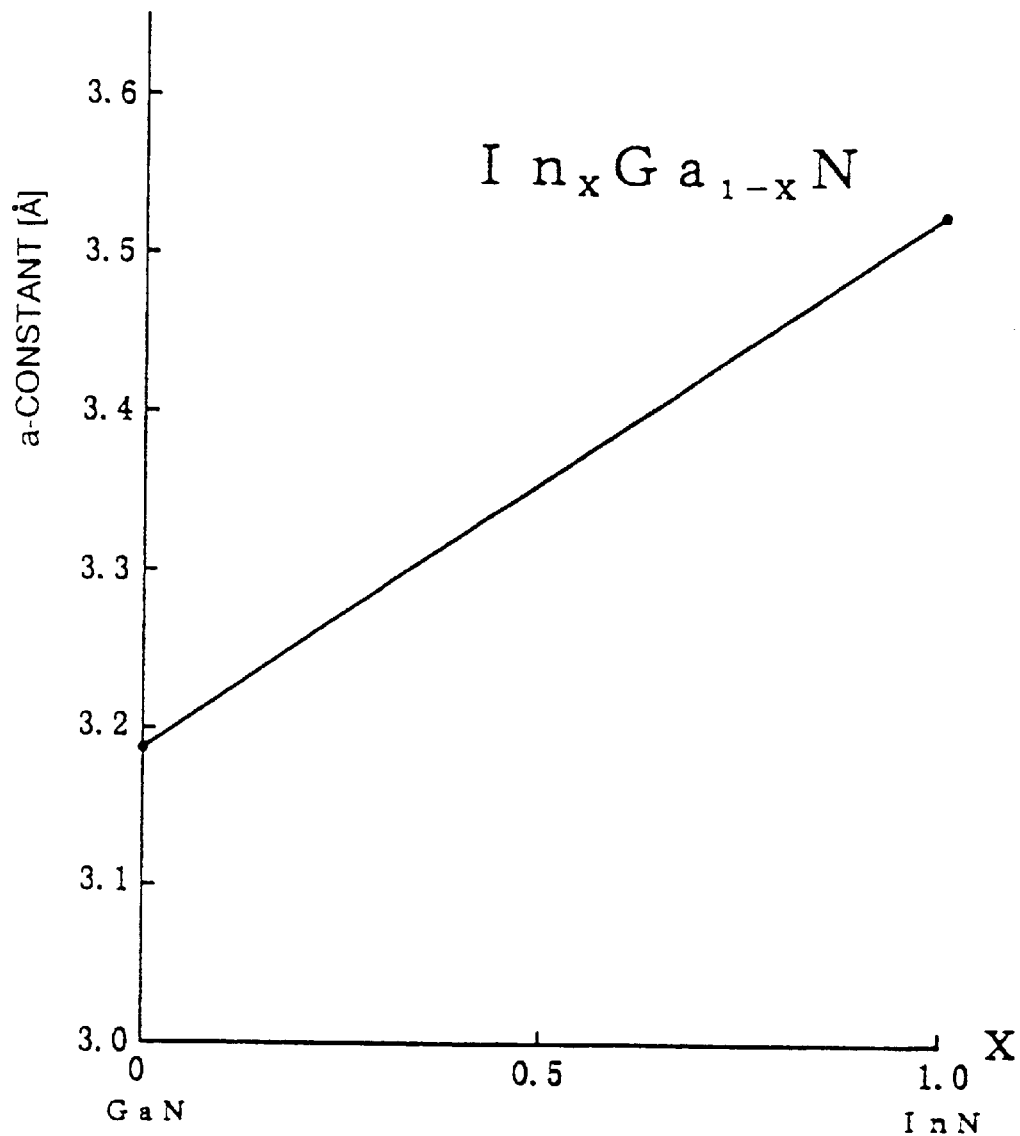
FIG. 7 is a graph showing the relationship between the a-constant and the composition of $In_xGa_{1-x}N$.

Although GaN is formed on a ZnO film in the above embodiments, the present invention is also applicable to a case in which InGaN, InAlGaN, or AlGaN is directly deposited on a ZnO film. For example, since the a-constant of $In_{0.2}Ga_{0.8}N$ is approximately 3.26 Å, which is derived from the relationship between the a-constant and the composition of $In_xGa_{1-x}N$ shown in FIG. 7, the a-constant of the ZnO film can be close to the a-constant of the $In_{0.2}Ga_{0.8}N$ when the c-constant of the ZnO film is 5.155 Å to 5.205 Å, according to the graph shown in FIG. 4.

(Fifth Embodiment)

Figure 8:
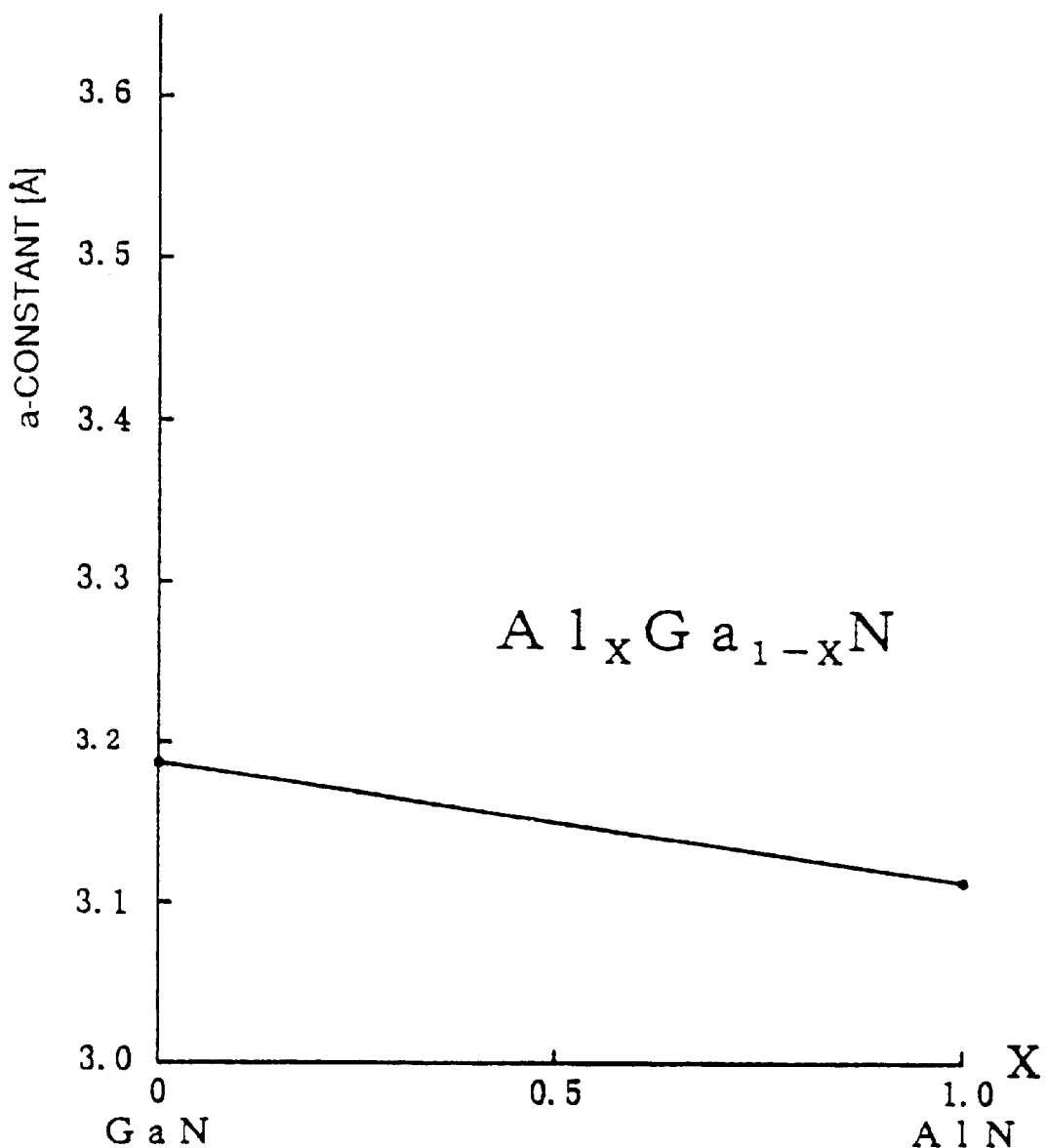
FIGS. 8 and 9 are graphs showing the relationship between the a-constant and the composition of $Al_xGa_{1-x}N$ and $In_xAl_yGa_zN$.

Since the a-constant of $Al_{0.2}Ga_{0.8}N$ is approximately 3.176 Å, which is derived from the relationship between the a-constant and the composition of $Al_xGa_{1-x}N$ shown in FIG. 8, the a-constant of the ZnO film can be close to the a-constant of the $Al_{0.2}Ga_{0.8}N$ when the c-constant of the ZnO film is 5.27 Å to 5.28 Å, according to the graph shown in FIG. 4.

(Sixth Embodiment)

Figure 9:
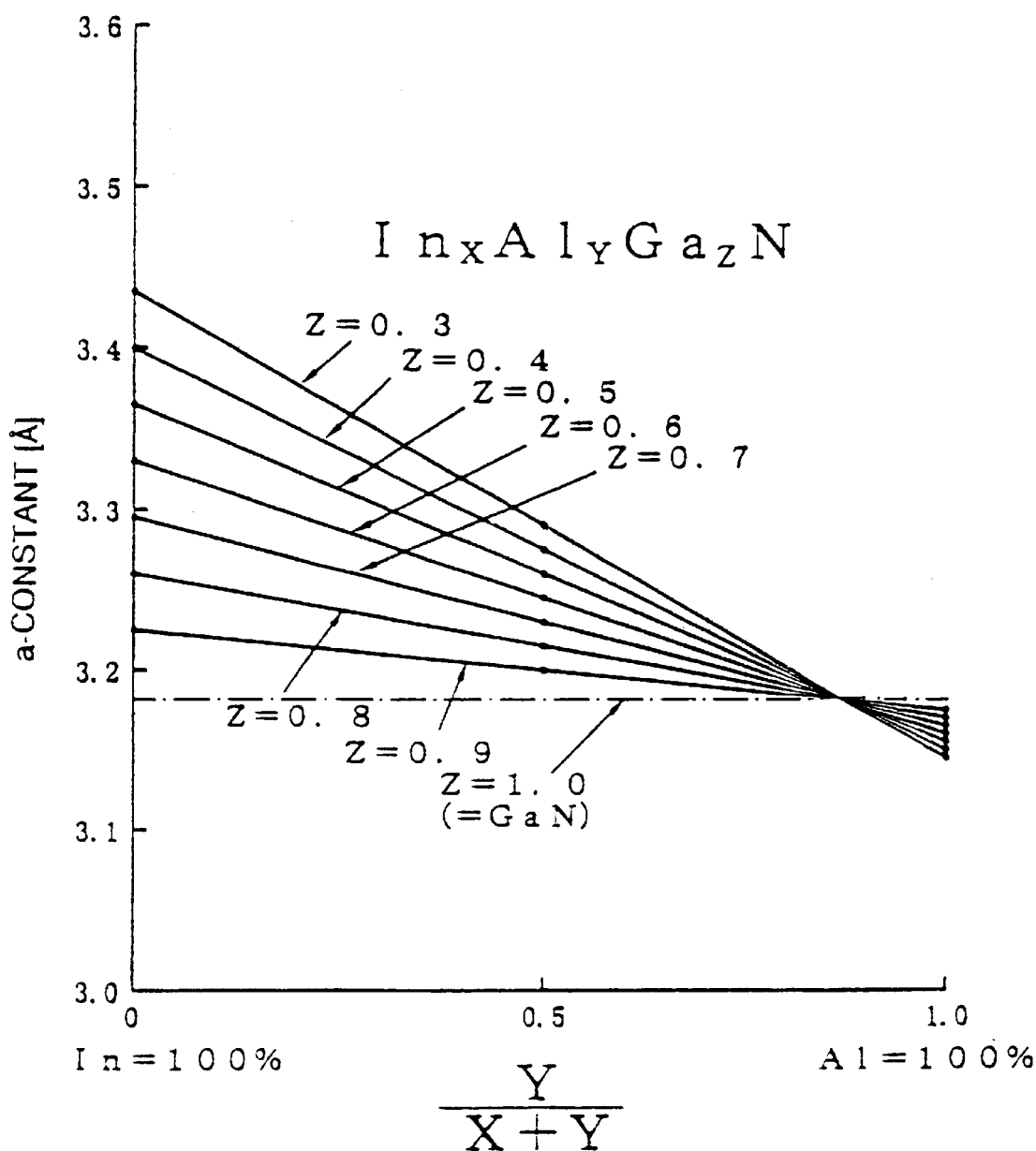

Since the a-constant of $In_{0.2}Al_{0.2}Ga_{0.6}N$ is approximately 3.245 Å, which is derived from the relationship between the a-constant and the composition of $In_xAl_yGa_zN$ (wherein x+y+z=1) shown in FIG. 9, the a-constant of the ZnO film can be closed to the a-constant of the $In_{0.2}Al_{0.2}Ga_{0.6}N$ when the c-constant of the ZnO film is 5.19 Å to 5.22 Å, according to the graph shown in FIG. 4. In this embodiment, a case wherein x=0.2, y=0.2, and z=0.6 is described. An optimized c-axis length of ZnO is derived from the graphs shown in FIGS. 4 and 9 in any other case and control is performed so as to achieve the optimized value.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method for making a semiconductor photonic device comprising a substrate; a ZnO buffer layer on the substrate; and a semiconductor compound represented by $In_xGA_yAl_zN$ wherein x+y+z=1, $0 \leq x \leq 1$, $0 \leq y \leq 1$ and $0 \leq z \leq 1$ on the ZnO buffer layer, wherein the ZnO buffer layer has a lattice constant of about 5.2070 Å or more in the c-axis direction which comprises adjusting the lattice constant in the c-axis direction of the ZnO buffer layer such that when the lattice constant in the a-axis direction of the semiconductor compound is smaller than the lattice constant in the a-axis direction of a ZnO single crystal, the lattice constant in the c-axis direction of the ZnO buffer layer is made larger than the lattice constant in the c-axis direction of the ZnO single crystal, and when the lattice constant in the a-axis direction of the semiconductor compound is larger than the lattice constant in the a-axis direction of a ZnO single crystal, the lattice constant in the c-axis direction of the ZnO buffer layer is made smaller than the lattice constant in the c-axis direction of the ZnO single crystal, whereby the lattice constant in the a-axis direction of the ZnO buffer layer is made nearly equal to the lattice constant in the a-axis direction of the semiconductor compound.

2. A method for making the semiconductor photonic device according to claim 1, wherein the ZnO buffer layer lattice constant is adjusted to about 5.2070 Å or more in the c-axis direction.

3. A method for making the semiconductor photonic device according to claim 2, wherein ZnO buffer layer is formed by sputtering and the lattice constant in the c-axis direction of the ZnO buffer layer is adjusted by controlling sputtering parameters of the ZnO sputtering process.

4. A method for making the semiconductor photonic device according to claim 3, wherein the sputtering parameter controlled is gas flow rate or temperature or both.

5. A method for making the semiconductor photonic device according to claim 1, wherein ZnO buffer layer is formed by sputtering and the lattice constant in the c-axis direction of the ZnO buffer layer is adjusted by controlling sputtering parameters of the ZnO sputtering process.

6. A method for making the semiconductor photonic device according to claim 5, wherein the sputtering parameter controlled is gas flow rate or temperature or both.

7. A method for making the semiconductor photonic device according to claim 1, wherein the ZnO lattice constant is adjusted to 5.155 to 5.28 Å in the c-axis direction.

8. A method for making the semiconductor photonic device according to claim 1, wherein the ZnO lattice constant is adjusted to about 3.17 to 3.27 Å in the a-axis direction.

* * * * *